United States Patent [19]

Hanneman et al.

[11] Patent Number: 5,063,267

[45] Date of Patent: Nov. 5, 1991

[54] HYDROGEN SILSESQUIOXANE RESIN FRACTIONS AND THEIR USE AS COATING MATERIALS

[75] Inventors: Larry F. Hanneman; Theresa E. Gentle, both of Midland, Mich.; Kenneth G. Sharp, Landenberg, Pa.

[73] Assignee: Dow Corning Corporation, Midland, Mich.

[21] Appl. No.: 618,865

[22] Filed: Nov. 28, 1990

[51] Int. Cl.$^5$ .......................... C08K 3/22; C08K 5/05; C08L 83/05
[52] U.S. Cl. ..................... 524/284; 427/387; 427/226; 423/324; 423/325; 556/451; 528/31; 524/356; 524/379; 524/366; 524/588
[58] Field of Search ............... 427/387, 226; 423/324, 423/325, 338; 556/451; 501/12; 524/284

[56] References Cited

U.S. PATENT DOCUMENTS 3,615,272 10/1971 Collins et al.
4,723,978 2/1988 Clodgo et al. ................ 156/643
4,756,977 7/1988 Haluska et al. ............... 427/387
4,826,943 5/1989 Ito et al. ...................... 528/32
4,999,397 3/1991 Weiss et al. .................. 427/58

FOREIGN PATENT DOCUMENTS 0255226 2/1988 European Pat. Off.
57-010627 1/1982 Japan.
61-127732 6/1986 Japan.
1-203013 8/1989 Japan.

OTHER PUBLICATIONS

M. Bohdanecky et al., Coll. Czech. Chem. Comm., 40, 2616 (1975).
Krukonis, Polymer News, vol. 11, pp. 7-16 (1985).
Yilgor et al., Polymer Bulletin, 12, 491-506, (1984).

Primary Examiner—Shrive Beck
Assistant Examiner—Cary A. Veith
Attorney, Agent, or Firm—Roger E. Gobrogge

[57] ABSTRACT

The present invention relates to hydrogen silsesquioxane resin (H-resin) fractions derived from an extraction process using one or more fluids at, near or above their critical state. These fractions can comprise narrow molecular weight fractions with a dispersity less than about 3.0 or fractions useful for applying coatings on substrates. The invention also relates to a method of using these fractions for forming ceramic coatings on substrates.

10 Claims, No Drawings

HYDROGEN SILSESQUIOXANE RESIN FRACTIONS AND THEIR USE AS COATING MATERIALS

BACKGROUND OF THE INVENTION

The present invention relates to hydrogen silsesquioxane resin (H-resin) fractions derived from an extraction process using one or more fluids at, near or above their critical state. These fractions can comprise narrow molecular weight fractions with a dispersity less than about 3.0 or fractions useful for applying coatings on substrates. The invention also relates to a method of using these fractions for forming ceramic coatings on substrates.

Hydrogen silsesquioxane resin of the formula $[HSiO_{3/2}]_n$ is known in the art. For instance, Collins et al. in U.S. Pat. No. 3,615,272 describe a soluble resin produced by the hydrolysis of trichlorosilane, trimethoxsilane or triacetoxysilane in a hydrolysis medium formed by the reaction of concentrated sulfuric acid with an aromatic hydrocarbon. The resin obtained thereby has a large dispersity and comprises a wide range of molecular weight species including low molecular weight volatile components and high molecular weight gels.

Similarly, Bank et al. in U.S. patent application Ser. No. 07/401,726, now U.S. Pat. No. 5,010,159 issued on Apr. 23, 1991 describe an analogous hydrolysis method which additionally involves neutralizing the resultant product with a base. As with Collins et al. supra, the resin produced by this method contains the same large dispersity and wide range of molecular weight species.

Methods of fractionating polymers are likewise known in the art. Such methods are generally liquid solution based and merely involve the addition of a non-solvent to a liquid solution of the polymer to precipitate out a desired fraction. Such processes are considered non-feasible for H-resin, however, since it is quite soluble and/or unstable in common solvents.

Supercritical fluid fractionation is also known in the art. For instance, Krukonis in Polymer News, vol. 11, pp. 7–16 (1985) describes the supercritical fluid fractionation of various silicon-containing polymers such as polydimethylsiloxanes and polycarbosilanes to produce narrow molecular weight fractions.

Yilgor et al. in Polymer Bulletin, 12, 491–506 (1984) also discuss the use of supercritical fluids in the separation, purification or fractionation of various chemical compositions to produce results which are difficult to obtain by conventional techniques. Included therein is a discussion of the use of this technique for fractionation and purification of functional siloxane oligomers.

The art also teaches that narrow molecular weight fractions of certain resins are superior for use in pressure sensitive adhesives (PSAs). For instance, European Patent Application, EP 255,226 teaches that MQ resins with a dispersity of about 2 or less when combined with polydimethylsiloxane gum provide PSAs with superior peel adhesion, quick stick, or shear.

Furthermore, the art also teaches that hydrogen silsesquioxane resin derived thin film ceramic coatings can be applied on various substrates including electronic devices and circuits. For instance, Haluska et al. in U.S. Pat. No. 4,756,977 disclose silica coatings produced by applying a solution of hydrogen silsesquioxane to a substrate followed by conversion of the resin to silica by heating to temperatures of 200°–1000° C. The ceramic coatings produced by this method are taught to have many desirable characteristics such as microhardness, moisture resistance, ion barrier, adhesion, ductility, tensile strength, low electrical conductance and thermal expansion coefficient matching that make such coatings especially valuable.

The present inventors have now discovered that hydrogen silsesquioxane resin can be fractionated into various novel molecular weight fractions and that these fractions are useful for the deposition of ceramic coatings on various substrates including electronic devices.

SUMMARY OF THE INVENTION

The present invention relates to a composition of matter comprising various molecular weight fractions of hydrogen silsesquioxane resin and uses therefore. Specifically, the present application claims those fractions with a dispersity less than about 3.0, those fractions with a number average molecular weight of between about 700 and about 6000 and with a dispersity less than about 3.0, and those fractions wherein about 90% of the polymeric species have a molecular weight between about 500 and 10,000.

In addition, the present invention relates to a method of forming a ceramic coating on a substrate. The method comprises coating the substrate with a solution comprising a solvent and a fraction of hydrogen silsesquioxane resin with a number average molecular weight between about 700 and about 6000 and a dispersity of less than about 3.0. The solvent is evaporated to deposit a preceramic coating on the substrate. The preceramic coating is then subjected to a temperature sufficient to facilitate conversion of the preceramic coating to a ceramic coating.

DETAILED DESCRIPTION OF THE INVENTION

The present invention is based on the discovery that hydrogen silsesquioxane resin can be fractionated using one or more fluids at, near or above their critical point. In addition, it has been shown that various molecular weight fractions derived therefrom have unique coating properties. For instance, it has been shown that fractions with a number average molecular weight in the range of about 700 to about 6000 and with a dispersity of less than about 3.0 provide superior, crack-free coatings on a variety of substrates.

Because these fractions have desirable coating characteristics, they are advantageous for coating substrates such as electronic devices, electronic circuits or plastics including, for example, polyimides, epoxides, polytetrafluoroethylene and copolymers thereof, polycarbonates, acrylics and polyesters. However, the choice of substrates and devices to be coated by the instant invention is limited only by the need for thermal and chemical stability of the substrate at the temperature and atmosphere used for deposition. The coatings taught herein may serve as protective coatings, passivation layers, interlevel dielectric layers, doped dielectric layers to produce transistor like devices, pigment loaded binder systems containing silicon to produce capacitor and capacitor like devices, multilayer devices, 3-D devices, silicon on insulator devices, super lattice devices, protective layers for high temperature superconductors and the like.

In the present invention the expression "ceramic" includes amorphous silica as well as silica-like materials that are not fully free of residual hydrogen or silanol but are otherwise ceramic in character. The expressions "electronic device" or "electronic circuit" include, but are not limited to, silicon based devices, gallium arsenide based devices, focal plane arrays, opto-electronic devices, photovoltaic cells and optical devices. The expression "critical point", as well known in the art, describes the point at which a fluid totally vaporizes and is transformed into a single phase due to the application of a given temperature and pressure. The critical points for many compounds are known in the art and recorded in various textbooks. The expression "supercritical" is used to describe fluids which are at or above this critical point. The molecular weights as set forth herein were obtained by gel permeation chromatography (GPC) using polydimethylsiloxane standards. The mobile phase in the GPC analysis was toluene, the flow rate was 1.50 ml/min, the temperature was 45.0° C. and the concentration (wt/vol %) was 1.00.

The H-resin which is fractionated as described herein may be produced by any means which results in a soluble resin. Examples of known methods are described in U.S. Pat. No. 3,615,272 granted to Collins et al. and assigned to Dow Corning Corporation and U.S. patent application Ser. No. 07/401,726 in the name of Bank et al. and assigned to Dow Corning Corporation, both of which are hereby incorporated by reference. The processes described in these references involve a scarce water hydrolysis in which a hydridosilane with 3 hydrolyzable groups (such as trichlorosilane, trimethoxysilane or triacetoxysilane) is hydrolyzed and condensed in an arylsulfonic acid hydrate solution formed by the reaction of sulfuric acid and an aromatic hydrocarbon. The polymers formed thereby, when washed and/or neutralized, are soluble in many common solvents.

The above soluble resins are easily fractionated using a variety of fluids at, near or above their critical point. A fractionation process using such fluids capitalizes on their unique dissolving characteristics to separate materials. Such characteristics include their sensitivity to both temperature and pressure changes such that a small change in temperature and/or pressure may result in a significant change in solute solubility. This allows for extremely accurate control of solvent strength and, thus, precise control in separating materials with similar dissolution characteristics. Additionally, fluids at or above their critical point also have a high mass-transfer rate between phases due to their gaseous-like low viscosity and a high diffusivity. Finally, the lack of surface tension in such fluids provides excellent wetting and penetration into microporous structures.

Because of the above characteristics of fluids at, near or above their critical point, various processes can be designed for separating materials or, in this case, fractionating polymers. Such processes generally comprise (1) contacting the polymer to be fractionated with a fluid at, near or above its critical point for a time sufficient to dissolve a fraction of the polymer; (2) separating the fluid containing the fraction from the residual polymer; and (3) recovering the desired fraction.

Central to all such processes is an extraction vessel which holds the material to be fractionated and is designed to tolerate the temperature and pressure needed to dissolve the material to be extracted. During operation, the material to be fractionated is charged into the extraction vessel and an extraction fluid at an appropriate temperature and pressure passed therethrough to dissolve the material to be extracted. Any material which is insoluble in the extraction fluid at the specified conditions of temperature and pressure remains in the vessel.

The solution comprising the extracted material dissolved in the extraction fluid is removed from the residual material and the extracted material is then recovered from the solution. Generally, such recovery is accomplished by passing the solution through an area in which the temperature and/or pressure is changed such that the material is no longer soluble in the fluid and, therefore, precipitates out of solution. These precipitates are then merely collected in a separation chamber by a process such as simple filtration. The solute-free extraction fluid may either be disposed of or it may be returned to the appropriate pressure and temperature and pumped back through the extraction vessel.

Such a process can easily accommodate the fractionation of H-resin. For example, an extraction vessel may be charged with a sample of H-resin and an extraction fluid contacted therewith by a method such as simply passing the fluid through the extraction vessel. The extraction fluid as well as its temperature and pressure should be such that only the desired molecular weight fractions of H-resin are dissolved. The charge remaining after this extraction would contain those H-resin fractions not soluble in the fluid at the specified conditions of temperature and pressure as well as any other insoluble materials such as gels or contaminants.

The solution comprising the desired fractions of H-resin dissolved in the extraction fluid is removed from the residual resin and the desired fraction then recovered from the solution. Generally, the recovery is accomplished by passing the solution through an area in which the pressure is changed such that the desired H-resin fractions are no longer soluble in the fluid and, therefore, precipitate out of solution. These precipitates are then merely collected in a separation chamber by a process such as simple filtration.

The extraction fluids which can be used in this process include any compound which, when at, near or above its critical point, will dissolve the fraction of H-resin desired and not dissolve the remaining fractions. Additional consideration, however, is usually given to the critical temperature and pressure of the solvent compound so that unreasonable measures are not necessary to reach the appropriate point. Examples of specific compounds which are functional herein include, but are not limited to, carbon dioxide and most low molecular weight hydrocarbons such as ethane or propane.

For the use of carbon dioxide, the critical temperature is about 31° C. and the critical pressure about 1073 psi. Therefore, temperatures and pressures at, near or above this range are generally necessary to achieve dissolution. The inventors herein have found that at a temperature of about 80° C. various fractions of H-resin may be dissolved in $CO_2$ at pressures in the range of about 1000 to about 4000 psi.

For the use of ethane, the critical temperature is about 32° C. and the critical pressure about 717 psi. The inventors have also found that by using this agent at a temperature of about 55°-70° C. and a pressure of 900-2500 psi several narrow molecular weight fractions can be separated.

For the use of propane, the critical temperature is about 95.6° C. and the critical pressure about 632 psi. The inventors have also found that by using this agent at a temperature of about 80°-120° C. and a pressure of about 1000-5000 psi they have been able to separate various narrow molecular weight fractions.

In addition, near critical liquids (ncl) may also be used to extract various molecular weight fractions. As used herein, the expression near critical liquid is used to describe those fluids which are near, but not at, their critical point and yet have dissolution characteristics conducive to H-resin fractionation. For instance, the inventors herein have found that propane in its near critical state at a temperature of about 60°-80° C. and a pressure of about 1000-5000 psi can easily extract various narrow fractions with a Mw peak in the range of about 7000-12000.

It is also contemplated herein that combinations of the above fluids may be used for the complete fractionation of a single polymeric sample. For instance, as set forth in Example 2 below supercritical ethane may be used to remove various low and medium molecular weight fractions, supercritical propane may be used to remove various medium to high molecular weight fractions, and near critical propane used to remove the high molecular weight fractions.

Sufficient volumes of the above extraction fluids should flow through the extraction vessel at a rate which removes all or a majority of the H-resin fraction which is soluble at the specified conditions of temperature and pressure. For instance, one may initiate a flow of the extraction fluid through the extraction vessel at a desirable rate and then discontinue the flow when the desired fraction is no longer being collected in the separation chamber.

In addition to the above process wherein the extraction fluid is used at a constant pressure, it has also been discovered that the use of pressure pulses during extraction may be advantageous for increasing the rate and extent of fractionation. Such pressure pulses are usually achieved by increasing and decreasing the pressure of the extraction fluid about a desired pressure in a periodic manner. Exemplary of such a process would be one wherein the pressure is increased and decreased about a median pressure over a pressure range of about 100 to 400 psi in a sinusoidal manner, square wave manner, saw-tooth wave manner, or any combination thereof such that each cycle takes from about 5 minutes to about 1 hour. While not being limited by the theory, it is believed that the use of such pressure pulses has a mechanical effect on the resin which results in a convective flow of the extraction fluid within the resin.

Once the desired molecular weight fraction of H-resin has been dissolved in the solvent, it is passed through an area in which the temperature and/or pressure is changed such that the fraction is no longer soluble in the extraction fluid and, therefore, precipitates out of solution. Generally, this is accomplished by passing the solution through a pressure reduction valve. The precipitated material is then simply collected in a separation chamber by simple filtration. The extraction fluid, then free of solutes, may either be discarded or it may be recompressed and/or heated to the desired state and pumped back through the extraction vessel.

Alternative processes which achieve the desired fractionation are also contemplated herein. For example, the above process may be modified such that various H-resin fractions are sequentially precipitated from the extraction fluid in a series of collection vessels. In such a process, the entire charge of H-resin (or a desirable portion thereof) may be dissolved in the extraction fluid. The resultant solution may then be subjected to incremental decreases in solvent strength by appropriate changes in pressure and/or temperature such that only the desired molecular weight fraction of the resin precipitates. After each change in pressure and/or temperature, the precipitates are collected and the solution with the remaining molecular weight fractions are subjected to further changes in pressure and/or temperature so as to precipitate out additional fractions.

In addition, it is also contemplated herein that the above process may be modified such that an H-resin charge is placed in the extraction vessel and then those fractions not desired are extracted by the above process. In such an embodiment of this invention, the residual resin remaining in the extractor after such extraction is merely collected and used as desired.

By the above methods, one can recover nearly any fraction of the H-resin desired. It is preferred, however, that the process of the invention be used to recover those fractions wherein about 90% of the polymeric species have a molecular weight between about 500 and 10,000 or those which have a number average molecular weight in the range of about 700 to about 6000 and a dispersity of less than about 3.0. It is more preferred to recover those fractions wherein about 95% of the polymeric species have a molecular weight between about 500 and about 10,000 or those which have a number average molecular weight in the range of about 800 to about 3000 and a dispersity of less than about 3.0. Since unfractionated H-resin has greater than about 10% of its polymeric species outside this range, many undesirable coating characteristics (discussed infra) can be avoided by fractionation.

Other equivalent methods, however, which result in obtaining the fractions described herein are also contemplated. These fractions can be useful for many purposes including, for example, use as standards and use in applying coatings with enhanced properties on various substrates.

Those fractions with a number average molecular weight less than about 700, even with a low dispersity, are primarily volatile components. When they are included in coating solutions they tend to volatilize out during pyrolysis causing decreased char yields, film stress and cracking resulting from coating shrinkage, and decreased density due to pinholes and pores formed as they escape. In addition, such volatilized fractions can coalesce in the vapor phase and precipitate out on the surface of the coating during pyrolysis.

The prior art teaches that the addition of a platinum or rhodium catalyst to a coating solution may help to moderate, but not eliminate, some of the above problems associated with these volatile components (U.S. Pat. No. 4,822,697). Such catalysts, however, act as contaminants to decrease the quality of films derived from such solutions. Fractionation of the H-resin so as to remove these volatile fractions prior to use, therefore, is also seen to be particularly advantageous since the need for inclusion of such additives/contaminants may thereby be eliminated.

H-resin fractions with a number average molecular weight between about 700 and about 6000 and with a dispersity less than about 3.0 have ideal coating characteristics. They lack most of the low molecular weight volatile components which cause the above described detrimental effects and they are easily dissolved and applied on various substrate surfaces. In addition, these fractions melt at a temperatures below that necessary for oxidation to silica and, therefore, "flow" upon heating to fill and heal any cracks that may form during coating application.

H-resin fractions with a number average molecular weight greater than about 6000 and a low dispersity do provide films with excellent char yields and density. Unfortunately, these high molecular weight fractions are often difficult to dissolve in solvents commonly used for coating solutions. In addition, these high molecular weight fractions do not have the above described "flow" characteristics which are beneficial in producing high quality coatings.

It can be seen, therefore, that a typical unfractionated H-resin sample which contains a blend of each of the above molecular weight fractions will have a mixture of the above advantages and disadvantages. By utilizing fractionated H-resin, one can produce coating solutions which have only those characteristics desired.

In addition, the use of fractionated H-resin also allows one to a develop a reproducible coating process. Such reproducibility has not been achievable up to this point with H-resin since various batches have varying molecular weight distributions and, therefore, varying quality of coatings, varying solution viscosity and varying coating thicknesses.

Finally, fractionation is also desirable in that many contaminants are not soluble in the extraction fluid and, thus, are removed from the H-resin sample. Since such contaminants are often associated with flaws in coatings their removal is seen as particularly advantageous.

The coatings derived from the above fractions are applied to various substrates by a method which comprises:

coating the substrate with a solution comprising a solvent and the desired H-resin molecular weight fraction;

evaporating the solvent to deposit a preceramic coating on the substrate; and subjecting the preceramic coating to a temperature sufficient to facilitate conversion of the preceramic coating to a ceramic coating.

The above H-resin fraction is initially dissolved in a solvent to form a solution for application. Various facilitating measures such as stirring and/or heat may be used to assist in this dissolution. The solvent to be used in the instant invention can be any agent or mixture of agents which will dissolve and stabilize the fraction without altering the ceramic coating produced thereby. These solvents can include, for example, alcohols such as ethyl or isopropyl, aromatic hydrocarbons such as benzene or toluene, alkanes such as n-heptane or dodecane, ketones, esters, glycol ethers or cyclic dimethylpolysiloxanes, in an amount sufficient to dissolve the above materials to low solids. For instance, enough of the above solvent can be included to form a 0.1-50 weight percent solution.

In addition to the above H-resin fractions, the coating solution may also include a modifying ceramic oxide precursor. The modifying ceramic oxide precursors that can be used herein include compounds of various metals such as aluminum, titanium, zirconium, tantalum, niobium and/or vanadium as well as various non-metallic compounds such as those of boron or phosphorous. The expression "modifying ceramic oxide precursor", therefore, includes such metal and non-metal compounds having one or more hydrolyzable groups bonded to the above metal or non-metal. Examples of hydrolyzable groups include, but are not limited to, alkoxy, such as methoxy, ethoxy, propoxy etc., acyloxy, such as acetoxy, or other organic groups bonded to said metal or non-metal through an oxygen. These compositions must form soluble solutions when mixed with the fraction and must be capable of being hydrolyzed, and subsequently pyrolyzed, at relatively low temperatures and relatively rapid reaction rates to form modifying ceramic oxide coatings. When such a modifying ceramic oxide precursor is used, it is generally present in the preceramic mixture in an amount such that the final ceramic coating contains 0.1 to 30 percent by weight modifying ceramic oxide.

A platinum or rhodium catalyst may also be included in the above coating solution to increase the rate and extent of silica conversion. Generally, however, such a catalyst will not be necessary since the low molecular weight fractions have been removed. Any platinum or rhodium compound or complex that can be solubilized in this solution will be operable. For instance, an organoplatinum composition such as platinum acetylacetonate or rhodium catalyst $RhCl_3[S(CH_2CH_2CH_2CH_3)_2]_3$, obtained from Dow Corning Corporation, Midland, Mich. are all within the scope of this invention. The above catalysts are generally added to the solution in an amount of between about 5 and 500 ppm platinum or rhodium based on the weight of the H-resin fraction.

The solution containing the H-resin fraction, solvent and, optionally, a modifying ceramic oxide precursor and/or a platinum or rhodium catalyst is then coated onto the substrate. The method of coating can be, but is not limited to, spin coating, dip coating, spray coating or flow coating.

The solvent is allowed to evaporate resulting in the deposition of a preceramic coating. Any suitable means of evaporation may be used such as simple air drying by exposure to an ambient environment or by the application of a vacuum or mild heat. It is to be noted that when spin coating is used, an additional drying period is generally not necessary as the spinning drives off the solvent.

The preceramic coating applied by the above methods is then converted to a silica ($SiO_2$) coating by subjecting it to a temperature sufficient for ceramification. Generally, this temperature is about 20° to about 1000° C. depending on the pyrolysis atmosphere. Higher temperatures usually result in quicker and more complete ceramification, but said temperatures also may have detrimental effects on various temperature sensitive substrates. The preceramic coatings are usually subjected to these temperatures for a time sufficient to ceramify the coating, generally up to about 6 hours, with a range of between about 5 minutes and about 2 hours being preferred.

The above heating may be conducted at any effective atmospheric pressure from vacuum to superatmospheric and under any effective gaseous environment such as those comprising air, $O_2$, an inert gas ($N_2$, etc.), ammonia, amines, etc. It is especially preferred, however, to heat under a wet ammonia atmosphere to hydrolyze the Si—H bonds and then under a dry ammonia atmosphere to effect removal of any remaining Si—OH groups.

Any method of heating such as the use of a convection oven, rapid thermal processing, or radiant or microwave energy is generally functional herein. The rate of heating, moreover, is also not critical, but it is most practical and preferred to heat as rapidly as possible.

By the above methods a thin (less than 2 microns) ceramic planarizing coating is produced on the substrate. The coating smooths the irregular surfaces of various substrates and has excellent adhesion. In addition, the coating may be covered by other coatings such as further $SiO_2$ coatings, $SiO_2$/modifying ceramic oxide layers, silicon containing coatings, silicon carbon containing coatings, silicon nitrogen-containing coatings, silicon nitrogen-carbon containing coatings and/or diamond-like carbon coatings.

In a dual layer system, the second passivation layer may comprise silicon containing coatings, silicon carbon-containing coatings, silicon nitrogen-containing coatings, silicon carbon nitrogen containing coatings, an additional silicon dioxide coating (which may contain a modifying ceramic oxide) or a diamond-like carbon coating. In a triple layer system, the second passivation layer may comprise silicon carbon-containing coatings, silicon nitrogen-containing coatings, silicon carbon nitrogen containing coatings, an additional silicon dioxide coating (which may contain a modifying ceramic oxide), or a diamond-like carbon coating and the third barrier coating may comprise silicon coatings, silicon carbon-containing coatings, silicon nitrogen-containing coatings, silicon carbon nitrogen containing coatings, or a diamond-like carbon coating.

The silicon containing coating described above is applied by a method selected from the group consisting of (a) chemical vapor deposition of a silane, halosilane, halodisilane, halopolysilane or mixtures thereof, (b) plasma enhanced chemical vapor deposition of a silane, halosilane, halodisilane, halopolysilane or mixtures thereof, or (c) metal assisted chemical vapor deposition of a silane, halosilane, halodisilane, halopolysilane or mixtures thereof. The silicon carbon coating is applied by a means selected from the group consisting of (1) chemical vapor deposition of a silane, alkylsilane, halosilane, halodisilane, halopolysilane or mixtures thereof in the presence of an alkane of one to six carbon atoms or an alkylsilane, (2) plasma enhanced chemical vapor deposition of a silane, alkylsilane, halosilane, halodisilane, halopolysilane or mixtures thereof in the presence of an alkane of one to six carbon atoms or an alkylsilane or (3) plasma enhanced chemical vapor deposition of a silacyclobutane or disilacyclobutane as further described in U.S. patent application Ser. No. 07/336,927, which is incorporated herein in its entirety. The silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane, or mixtures thereof in the presence of ammonia, (C) plasma enhanced chemical vapor deposition of a $SiH_4$- $N_2$ mixture such as that described by Ionic Systems or that of Katoh et al. in the Japanese Journal of Applied Physics, vol. 22, #5, pp 1321–1323, (D) reactive sputtering such as that described in Semiconductor International, p 34, August 1987 or (E) ceramification of a silicon and nitrogen containing preceramic polymer. The silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of silane, alkylsilane, halosilane, halodisilane, halopolysilane or mixture thereof in the presence of an alkane of one to six carbon atoms or an alkylsilane and further in the presence of ammonia, (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia and (v) ceramification of a preceramic polymer solution comprising a carbon substituted polysilazane, polysilacyclobutasilazane or polycarbosilane in the presence of ammonia. The diamond-like carbon coatings can be applied by exposing the substrate to an argon beam containing a hydrocarbon in the manner described in NASA Tech Briefs, November 1989 or by one of the methods described by Spear in J. Am. Ceram. Soc., 72, 171–191 (1989). The silicon dioxide coating (which may contain a modifying ceramic oxide) is applied by the ceramification of a preceramic mixture comprising a silicon dioxide precursor (and a modifying ceramic oxide precursor) as in the initial coating.

Coatings produced by the instant invention possess low defect density and are useful on electronic devices as protective coatings, as corrosion resistant and abrasion resistant coatings, as temperature and moisture resistant coatings, as dielectric layers in, for instance, multilayer devices and as a diffusion barrier against ionic impurities such as sodium and chloride.

The following non-limiting examples are included so that one skilled in the art may more readily understand the invention.

EXAMPLE 1

60 grams of H-resin produced by the methods of U.S. patent application Ser. No. 07/401,726 (Mn 1525 and dispersity 8.01) was charged to an extraction vessel and the system was brought up to operating conditions without solvent passing through the liquid state. Supercritical carbon dioxide at 80° C. was delivered to the bottom of the vessel and allowed to percolate up through the resin. Step wise extraction of the H-resin fractions was achieved by gradually increasing the pressure in the vessel. The pressure used for each fraction was pulsed over a range of about 200 psi around the median pressure.

The supercritical carbon dioxide containing the resin fraction soluble under the specific conditions was taken off the top of the extraction vessel, passed through an appropriate pressure let down valve and into a fraction collection vessel. The resin precipitated at the greatly reduced pressure and was collected in the vessel and weighed.

By the above process 13 fractions were removed. 12 grams of charge remained in the vessel when the experiment was terminated. The following table summarizes the extraction conditions and provides the characteristics of the fractions obtained.

TABLE 1

Extraction Conditions and GPC Results - Carbon Dioxide at 80° C.

| FXN | Pressure (psig) | Mw Peak | Mn | Mw | Mz | D = $M_w/M_n$ |
|---|---|---|---|---|---|---|
| 1 | 1400–1600 | 437 | 361 | 414 | 459 | 1.14 |
| 2 | 1400–1600 | 450 | 364 | 422 | 471 | 1.16 |
| 3 | 1500–1700 | 450 | 376 | 437 | 491 | 1.16 |
| 4 | 1600–1800 | 479 | 417 | 484 | 552 | 1.16 |
| 5 | 1700–1900 | 494 | 429 | 508 | 591 | 1.18 |
| 6 | 1800–2100 | 494 | 445 | 552 | 672 | 1.24 |
| 7 | 1800–2100 | 918 | 655 | 853 | 1046 | 1.30 |

TABLE 1-continued

Extraction Conditions and GPC Results - Carbon Dioxide at 80° C.

| FXN | Pressure (psig) | Mw Peak | Mn | Mw | Mz | D = $M_w/M_n$ |
|---|---|---|---|---|---|---|
|  | 1900–2200 |  |  |  |  |  |
|  | 2000–2300 |  |  |  |  |  |
|  | 2100–2400 |  |  |  |  |  |
| 8 | 2200–2500 | 1105 | 822 | 1097 | 1345 | 1.33 |
|  | 2300–2600 |  |  |  |  |  |
| 9 | 2400–2700 | 1289 | 895 | 1298 | 1667 | 1.45 |
|  | 2500–2800 |  |  |  |  |  |
|  | 2600–2900 |  |  |  |  |  |
| 10 | 2700–3000 | 1812 | 1410 | 1893 | 2457 | 1.34 |
|  | 2800–3100 |  |  |  |  |  |
| 11 | 2900–3200 | 2881 | 2176 | 2949 | 3832 | 1.35 |
|  | 3100–3400 |  |  |  |  |  |
|  | 3400–3600 |  |  |  |  |  |
|  | 3500–3700 |  |  |  |  |  |
| 12 | 3600–3800 | 3577 | 2884 | 4065 | 5548 | 1.41 |
| 13 | 3700–3900 | 11946 |  |  |  |  |

Thermogravimetric analysis (TGA) was performed on four of the above fractions. TGA data were acquired on a DuPont 990 in air with a 10° C./min ramp rate to 800° C. The isothermal TGA was conducted by ramping 10° C./min to 400° C. and then holding at 400° C. for 1 hour. As is indicated in Table 2 below, the molecular weight fractions differed significantly in volatility as represented by char yield.

Four of the above fractions and a sample of the unfractionated resin were dissolved to 10 wt % solids in a solvent comprising 95 wt % heptane and 5 wt % dodecane. Platinum acetylacetonate was added to the solution in an amount of about 100–150 ppm based on the weight of the H-resin fraction. These solutions were spin coated at 3000 rpm for 10 seconds on Motorola CMOS devices and on 1 inch silicon wafers. The devices and wafers were then pyrolyzed in an oven at 400° C. in air for 1 hour. Coating thickness was determined by using a Rudolph AutoEllI Ellipsometry on the silicon wafers at wavelengths of 6328, 4050, and 8300 angstrom, the results of which were averaged. The thickness of the resultant films after pyrolysis and the percent decrease in thickness during pyrolysis are recorded in Table 2. Scanning electron microscopy at 35× up to 3500× was also used to examine the silica coatings on the devices.

The low molecular weight Fraction 2 nearly completely volatilized during heating leaving no trace of the coating. The intermediate weight fraction 10 provided an excellent coating on the device. It was thicker and showed fewer cracks than that derived from unfractionated H-resin.

Various fractions of the H-resin were also characterized by their melting points. Melting points were obtained using a Thomas Hoover capillary melting point apparatus. Table 2 clearly shows that those intermediate molecular weight fractions which provide excellent coatings melt and flow before the onset of oxidation (>200° C.) to eliminate coating defects.

TABLE 2

Characterization of Product

| FXN | Mn | Char Yield | Film Thickness (angstrom)[a] | % Decrease in thickness[b] | Melting Point (°C.) |
|---|---|---|---|---|---|
| 0 |  |  | 1777 | 35–40[c] |  |
| 1 | 361 |  |  |  | sublimes |
| 2 | 364 | 6.4% | 0 | 100.0 |  |
| 8 | 822 | 83.0% | 502 | 75.7 | 78–82 |
| 9 | 895 |  |  |  | 124–126 |
| 10 | 1410 | 100.0% | 1861 | 29.3 | 146–151 |
| 11 | 2176 |  |  |  | 160–178 |
| 12 | 2884 | >97.6%[d] | 2293 | 17.7 | never melted below 230 |

0 — unfractionated
[a] after pyrolysis
[b] during pyrolysis
[c] from previous data
[d] some lost in handling

EXAMPLE 2

10 grams of H-resin produced by the methods of U.S. patent application Ser. No. 401,726 was charged to an extraction vessel and fractionation proceeded in the same manner as Example 1 except that supercritical ethane/propane and near critical liquid (ncl) propane were used. The extraction conditions for this example are summarized in table 3 and the resultant characterization data summarized in Table 4.

TABLE 3

Extraction Conditions
Ethane/propane and near critical propane

| FXN | Temp (°C.) | Pressure (psig) | Solvent |
|---|---|---|---|
| 1 | 55 | 900–1200 | Ethane |
| 2 | 70 | 1100–1400 | Ethane |
| 3 | 70 | 1500–1700 | Ethane |
| 4A | 70 | 1700–2500 | Ethane |
| 4B | 70 |  | Ethane |
| 5 | 120 | 1200–1700 | Propane |
| 6 | 120 | 1700–2800 | Propane |
|  | 120 | 3000–5000 | Propane |
| 7 | 80 | 1000 | Propane (ncl) |

TABLE 4

GPC Characterization Data
Ethane/propane and near critical propane

| FXN | Mw Peak | Mn | Mw | Mz | D = $M_w/M_n$ |
|---|---|---|---|---|---|
| 1 | 450 | 406 | 460 | 520 | 1.13 |
| 2 | 465 | 428 | 505 | 597 | 1.18 |
| 3 | 1072 | 717 | 1057 | 1525 | 1.47 |
| 4A | 2319 | 1119 | 2242 | 3684 | 2.00 |
| 4B | 1181 | 974 | 1902 | 3677 | 1.95 |
| 5 | 5350 | 2345 | 6684 | 13491 | 2.85 |
| 6 | 8947 | * | * | * | * |
| 7 | 7867 | * | * | * | * |

*Data not available due to mechanical problems associated with the Gel Permeation Chromatograph

EXAMPLE 3

20 grams of H-resin produced by the methods of U.S. patent application Ser. No. 07/401,726 was charged to an extraction vessel and fractionation proceeded in the same manner as Example 1 except that supercritical ethane and near critical liquid propane was used. The extraction conditions for this example are summarized in Table 5 and the resultant characterization data summarized in Table 6.

TABLE 5

| | Extraction Conditions - 60° C. Ethane and near critical propane | |
|---|---|---|
| FXN | Pressure (psig) | Solvent |
| 1 | 1000-1200 | Ethane |
| 2 | 1100-1500 | Ethane |
| 3 | 1400-2200 | Ethane |
| 4 | 2200-2700 | Ethane |
| 5 | 2800-4300 | Ethane |
| 6 | 4100-5900 | Ethane |
| 7 | 5000 | Propane (ncl) |
| 8 | 5000 | Propane (ncl) |

TABLE 6

| | GPC Characterization Data Ethane and near critical propane | | | | |
|---|---|---|---|---|---|
| FXN | Mw Peak | Mn | Mw | Mz | $D = M_w/M_n$ |
| 1 | 448 | | | | |
| 2 | 527 | 559 | 867 | 1804 | 1.55 |
| 3 | 2029 | 1158 | 1954 | 2992 | 1.69 |
| 4 | 3733 | 1605 | 3879 | 6621 | 2.42 |
| 5 | 11472 | | | | |
| 6 | 13647 | | | | |
| 7 | 11110 | | | | |
| 8 | 10759 | 9300 | 21640 | 59417 | 2.33 |

What is claimed is:

1. Hydrogen silsesquioxane resin having a dispersity less than about 3.0.

2. The resin of claim 1 wherein the dispersity is less than about 2.0.

3. Hydrogen silsesquioxane resin wherein about 90% of the polymeric species have a molecular weight between about 500 and 10,000.

4. The resin of claim 3 wherein about 95% of the polymeric species have a molecular weight between about 500 and about 10,000.

5. Hydrogen silsesquioxane resin with a number average molecular weight of between about 700 and about 6000 and with a dispersity less than about 3.0.

6. The hydrogen silsesquioxane resin of claim 5 which has a number average molecular weight of between about 800 and about 3000 and a dispersity less than about 3.0.

7. The resin of claim 5 dissolved in one or more solvents selected from the group consisting of alcohols, aromatic hydrocarbons, alkanes, ketones, cyclic dimethlypolysiloxanes, esters or glycol ethers and the solvent is present in an amount sufficient to dissolve the hydrogen silsesquioxane fraction to between about 0.1 and about 50 weight percent.

8. The solution of claim 7 which also contains a modifying ceramic oxide precursor comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the ceramic coating contains 0.1 to 30 percent by weight modifying ceramic oxide.

9. The solution of claim 7 which also contains a platinum or rhodium catalyst in an amount of about 5 to about 500 ppm platinum based on the weight of the fraction.

10. The solution of claim 8 which also contains a platinum or rhodium catalyst in an amount of about 5 to about 500 ppm platinum based on the weight of the fraction.

* * * * *